(12) United States Patent
Choi

(10) Patent No.: US 11,694,949 B2
(45) Date of Patent: Jul. 4, 2023

(54) SEMICONDUCTOR PACKAGE AND METHOD OF MANUFACTURING THE SAME

(71) Applicant: Samsung Electronics Co., Ltd., Suwon-si (KR)

(72) Inventor: Yun-Seok Choi, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/529,194

(22) Filed: Aug. 1, 2019

(65) Prior Publication Data
US 2020/0312755 A1 Oct. 1, 2020

(30) Foreign Application Priority Data
Mar. 25, 2019 (KR) .......................... 10-2019-0033423

(51) Int. Cl.
H01L 23/498 (2006.01)
H01L 21/48 (2006.01)
H01L 23/00 (2006.01)
H01L 23/538 (2006.01)
H01L 23/485 (2006.01)

(52) U.S. Cl.
CPC ...... H01L 23/49816 (2013.01); H01L 21/486 (2013.01); H01L 21/4853 (2013.01); H01L 23/4855 (2013.01); H01L 23/49827 (2013.01); H01L 23/49838 (2013.01); H01L 23/5386 (2013.01); H01L 24/33 (2013.01)

(58) Field of Classification Search
CPC ........... H01L 23/49838; H01L 23/5386; H01L 23/5385; H01L 23/4855; H01L 23/5383; H01L 24/33; H01L 25/0655
See application file for complete search history.

(56) References Cited

U.S. PATENT DOCUMENTS

| | | | |
|---|---|---|---|
| 6,268,660 B1 | 7/2001 | Dhong et al. | |
| 8,227,904 B2 | 7/2012 | Braunisch et al. | |
| 8,803,336 B2 | 8/2014 | Lee et al. | |
| 9,059,179 B2 | 6/2015 | Karikalan et al. | |
| 9,087,765 B2 | 7/2015 | Chun et al. | |
| 9,209,156 B2 | 12/2015 | Len et al. | |
| 9,431,371 B2 | 8/2016 | Karikalan et al. | |
| 10,002,835 B2 | 6/2018 | Fasano et al. | |
| 2006/0226527 A1* | 10/2006 | Hatano | H01L 23/5389 438/109 |
| 2014/0091474 A1* | 4/2014 | Starkston | H01L 23/5226 361/767 |
| 2018/0374788 A1* | 12/2018 | Nakagawa | H01L 24/06 |

FOREIGN PATENT DOCUMENTS

KR 10-99578 12/2011

* cited by examiner

*Primary Examiner* — Victor A Mandala
*Assistant Examiner* — Lawrence C Tynes, Jr.
(74) *Attorney, Agent, or Firm* — Harness, Dickey & Pierce, P.L.C.

(57) ABSTRACT

A semiconductor package includes a package substrate, an interposer on the package substrate, and a first semiconductor device and a second semiconductor device on the interposer, the first and second semiconductor devices connected to each other by the interposer, wherein at least one of the first semiconductor device and the second semiconductor device includes an overhang portion protruding from a sidewall of the interposer.

21 Claims, 11 Drawing Sheets

SEMICONDUCTOR PACKAGE AND METHOD OF MANUFACTURING THE SAME

CROSS-REFERENCE TO RELATED APPLICATION

This application claims priority under 35 U.S.C. § 119 to Korean Patent Application No. 10-2019-0033423, filed on Mar. 25, 2019, in the Korean Intellectual Property Office, the disclosure of which is hereby incorporated by reference in its entirety.

TECHNICAL FIELD

Some example embodiments of the present disclosure relate to a semiconductor package and/or a method of manufacturing the same, and more specifically, to a semiconductor package including a plurality of chips and/or a method of manufacturing the same.

BACKGROUND

An electronic device includes a high bandwidth memory and a stacked chip package to provide a high performance, such as, a high capacitance and a high speed. A package used for such an electronic device may be provided with a high density interconnection using an extra substrate, such as a silicon interposer. However, chips mounted in the package may be designed to be arranged within an area of the silicon interposer, and thus a size of the silicon interposer may be increased. As a result, it is difficult to make the silicon interposer, and a manufacturing yield of the silicon interposer may be lowered.

SUMMARY

According to some example embodiments of the inventive concepts, a semiconductor package may include a package substrate, an interposer on the package substrate, and a first semiconductor device and a second semiconductor device on the interposer, the first and second semiconductor devices connected to each other by the interposer, wherein at least one of the first semiconductor device and the second semiconductor device includes an overhang portion protruding from a sidewall of the interposer.

According to some example embodiments of the inventive concepts, a semiconductor package may include a package substrate, a plurality of first solder bumps on the package substrate, an interposer on the plurality of first solder bumps, a plurality of second solder bumps on the interposer, a plurality of first wiring lines and a plurality of second wiring lines in the interposer, a first semiconductor device and a second semiconductor device on plurality of second solder bumps, the first semiconductor device and the second semiconductor device electrically connected to each other via the plurality of second wiring lines and the plurality of second solder bumps, and a plurality of through-electrodes in the interposer, and electrically connecting the plurality of first wiring lines and the plurality of first solder bumps, wherein at least one of the first and second semiconductor devices includes an overhang portion protruding from a sidewall of the interposer.

According to some example embodiments of the inventive concepts, a semiconductor package may include a package substrate, a plurality of first solder bumps on the package substrate, an interposer on the plurality of first solder bumps, and including a semiconductor substrate and a wiring layer on the semiconductor substrate, a plurality of second solder bumps and a plurality of third solder bumps on the wiring layer, a plurality of first wiring lines and a plurality of second wiring lines in the wiring layer, a first semiconductor device on the plurality of second solder bumps, a second semiconductor device on the plurality of third solder bumps, and electrically connected to the first semiconductor device via the plurality of second wiring lines, the plurality of second solder bumps and the plurality of third solder bumps, a plurality of through-electrodes through the semiconductor substrate, and electrically connecting the plurality of first wiring lines and the plurality of first solder bumps, a first supporter between the first semiconductor device and the package substrate, and a second supporter between the second semiconductor device and the package substrate.

According to some example embodiments of the inventive concepts, a method of manufacturing a semiconductor package may include stacking an interposer on a package substrate, stacking a first semiconductor device and a second semiconductor device on the interposer, underfilling a space between the interposer and the package substrate with a first adhesive, and underfilling a space between the interposer and each of the first and second semiconductor devices with a second adhesive. The first semiconductor device and the second semiconductor device may be spaced apart from each other and electrically connected to each other by the interposer. At least one of the first and second semiconductor devices may include an overhang portion protruding from a sidewall of the interposer.

DETAILED DESCRIPTION

Figure 1:
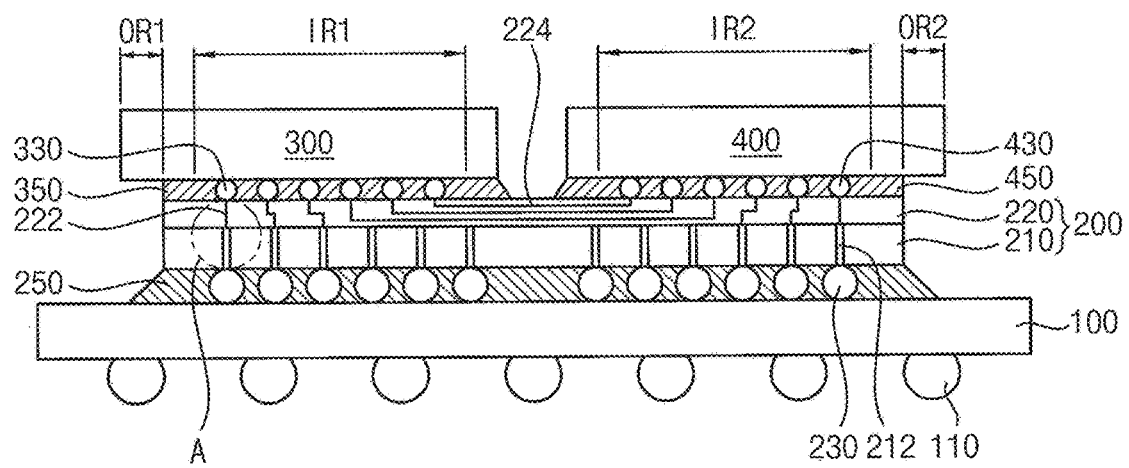
FIG. 1 is a cross-sectional view illustrating a semiconductor package according to some example embodiments of the inventive concepts.

Some example embodiments will now be described more fully hereinafter with reference to the accompanying drawings. Like reference numerals may refer to like elements throughout this application.

Figure 2:
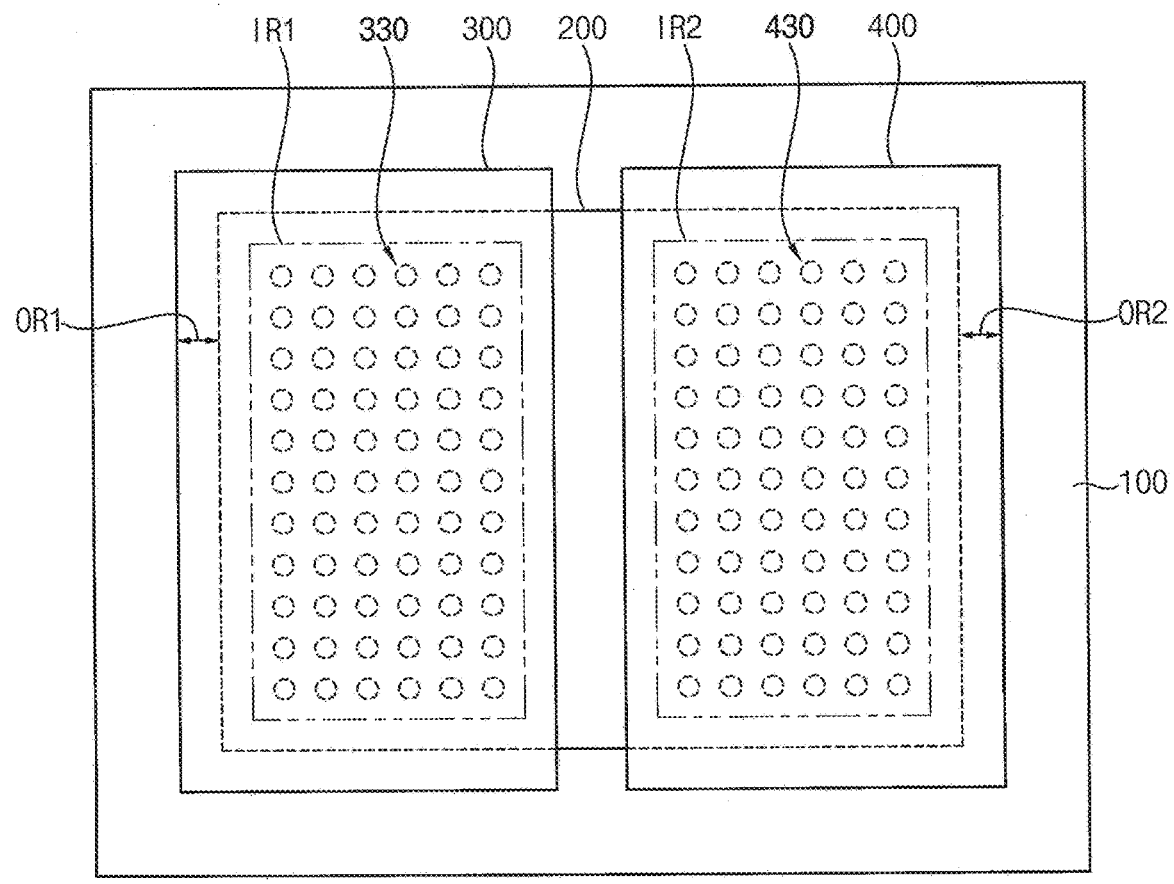
FIG. 2 is a plan view illustrating the semiconductor package of FIG. 1.
Figure 3:
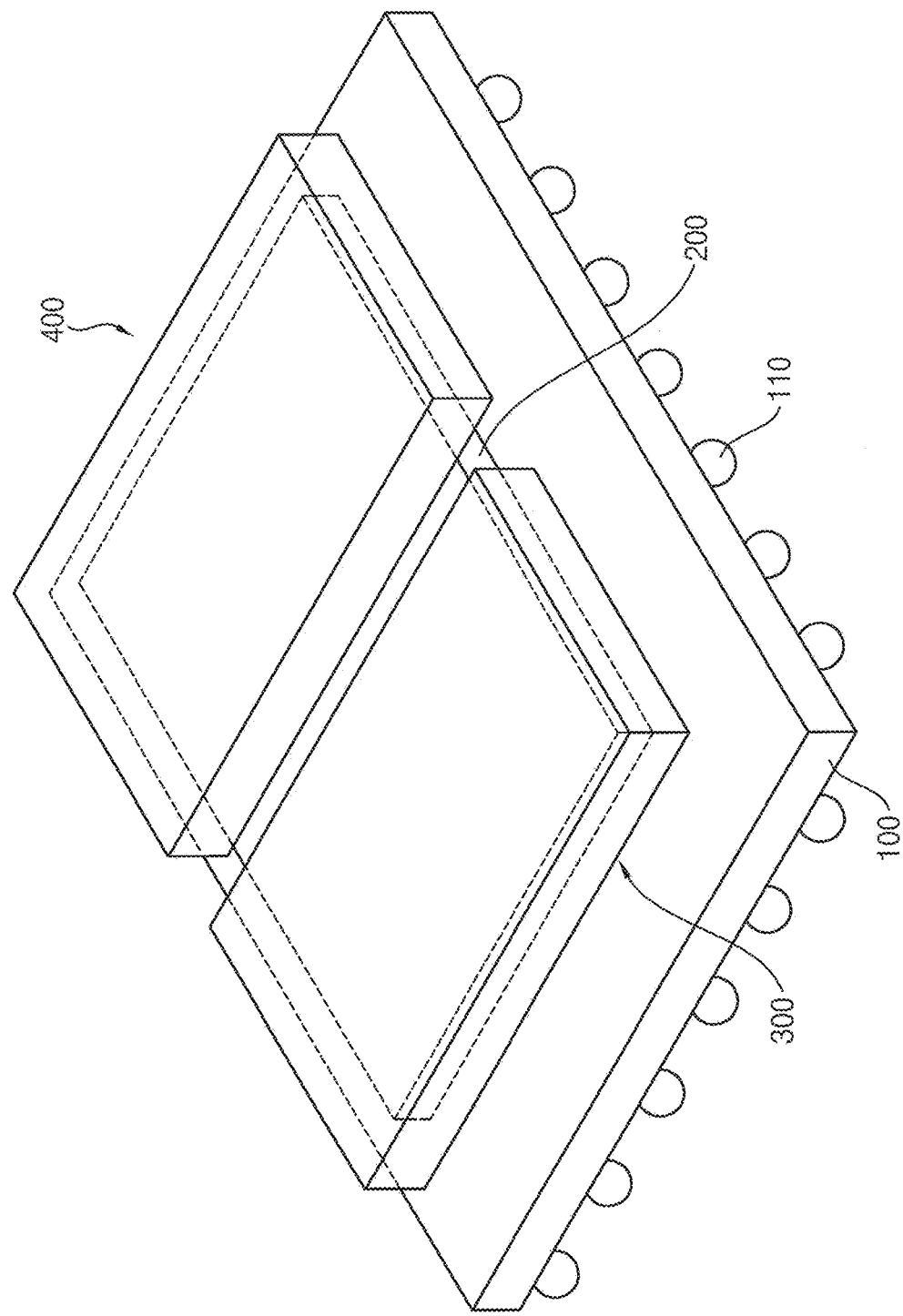
FIG. 3 is a perspective view illustrating the semiconductor package of FIG. 1.
Figure 4:
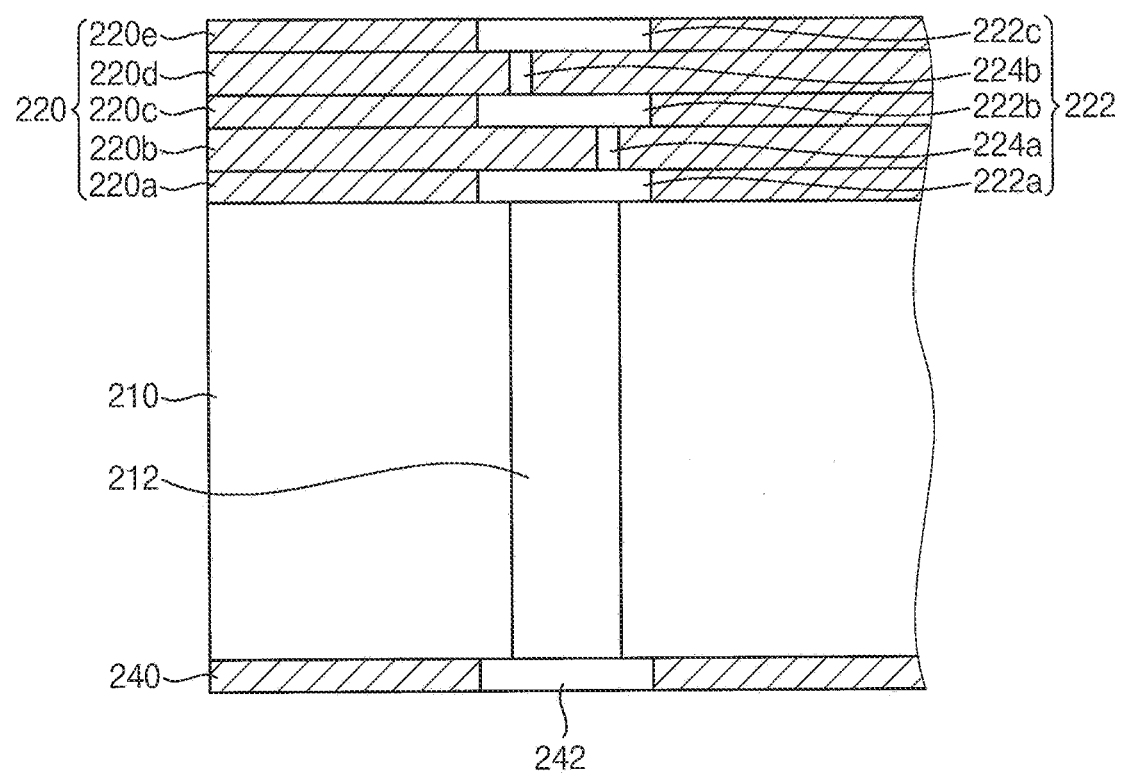
FIG. 4 is an enlarged cross-sectional view of portion "A" of FIG. 1.

FIG. 1 is a cross-sectional view illustrating a semiconductor package according to some example embodiments of the inventive concepts. FIG. 2 is a plan view illustrating the semiconductor package of FIG. 1. FIG. 3 is a perspective view illustrating the semiconductor package of FIG. 1. FIG. 4 is an enlarged cross-sectional view of portion "A" of FIG. 1.

Referring to FIGS. 1 to 4, a semiconductor package 10 may include a package substrate 100, an interposer 200, a first semiconductor device 300, and/or a second semiconductor device 400.

In some example embodiments, the semiconductor package 10 may include a memory device having a stacked chip structure in which a plurality of dies (chips) are stacked. For example, the semiconductor package 10 may include a semiconductor device with a 2.5D chip structure. In this case, the first semiconductor device 300 may include a logic semiconductor device, and the second semiconductor device 400 may include a memory device. The logic semiconductor device may include a CPU, a GPU, an ASIC, or an SOC. The memory device may include a high bandwidth memory device.

In some example embodiments, the package substrate 100 may have opposite lower and upper surfaces. For example, the package substrate 100 may be a printed circuit board (PCB). The PCB may be a multilayered circuit board including vias and various circuits therein.

The interposer 200 may be disposed on the package substrate 100. The interposer 200 may be mounted on the package substrate 100 by solder bumps 230. A planar area of the interposer 200 may be less than a planar area of the package substrate 100. The interposer 200 may be disposed within the area of the package substrate 100 in plan view.

The interposer 200 may be a silicon interposer including a plurality of connecting wiring lines therein. The first semiconductor device 300 and the second semiconductor device 400 may be connected to each other through the connecting wiring lines and/or may be electrically connected to the package substrate 100 through the solder bumps 230. The silicon interposer may provide a high density interconnection between the first and second semiconductor devices 300 and 400.

In some example embodiments, the interposer 200 may include a semiconductor substrate 210 and/or a wiring layer 220 including a plurality of wiring lines on an upper surface of the semiconductor substrate 210. The plurality of wiring lines may include first wiring lines 222 and/or second wiring lines 224. The semiconductor substrate 210 may include a plurality of through-electrodes 212 passing therethrough. Each of the through-electrodes 212 may include a through-silicon via (TSV). The interposer 200 may include a lower insulation layer 240 and/or a lower conductive pad 242 on a lower surface of the semiconductor substrate 210. The lower conductive pad 242 may be electrically connected to each of the through-electrodes 212.

The first wiring lines 222 may be electrically connected to the through-electrodes 212. The first and/or second semiconductor devices 300 and 400 may be electrically connected to the package substrate 100 through the first wiring lines 222 and the through-electrodes 212. The first semiconductor device 300 and the second semiconductor device 400 may be electrically connected to each other by the second wiring lines 224.

As shown in FIG. 4, the wiring layer 220 may include at least two metal wiring layers. The wiring layer 220 may include first, second, third, fourth, and/or fifth insulation layers 220a, 220b, 220c, 220d, and 220e. The first wiring lines 222 may include a first metal wiring line 222a, a first contact 224a, a second metal wiring line 222b, a second contact 224b, and/or a third metal wiring line 222c disposed in respective ones of the first to fifth insulation layers 220a, 220b, 220c, 220d, and 220e. At least a portion of the third metal wiring line 222c may serve as a connection pad and/or a landing pad. Solder bumps 330 and/or 430 may be disposed on the third metal wiring line 222c.

The first semiconductor device 300 may be disposed on the interposer 200. The first semiconductor device 300 may be mounted on the interposer 200 by a flip chip bonding method. In this case, the first semiconductor device 300 may be mounted on the interposer 200 so that an active surface of the first semiconductor device 300 on which chip pads are disposed faces the interposer 200. The chip pads of the first semiconductor device 300 may be electrically connected to the connection pads of the interposer 200 by conductive bumps, for example, the solder bumps 330.

The first semiconductor device 300 may include a connection area IR1 in which the chip pads are disposed. In plan view, the connection area IR1 of the first semiconductor device 300 may be located within the area of the interposer 200.

In some example embodiments, the first semiconductor device 300 may include an overhang portion OR1 protruding from a first sidewall from the interposer 200. An outer edge of the first semiconductor device 300 may protrude from the first sidewall of the interposer 200. The first semiconductor device 300 may extend laterally from the first sidewall of the interposer 200. In plan view, an outer edge of the interposer 200 may be located more inward than the outer edge of the first semiconductor device 300.

The second semiconductor device 400 may be disposed on the interposer 200 and may be spaced apart from the first semiconductor device 300. The second semiconductor device 400 may be mounted on the interposer 200 by a flip chip bonding method. In this case, the second semiconductor device 400 may be mounted on the interposer 200 so that an active surface of the second semiconductor device 400 on which chip pads are disposed faces the interposer 200. The chip pads of the second semiconductor device 400 may be electrically connected to the connection pads of the interposer 200 by conductive bumps, for example, the solder bumps 430.

The second semiconductor device 400 may include a connection area IR2 in which the chip pads are disposed. In plan view, the connection area IR2 of the second semiconductor device 400 may be located within the area of the interposer 200.

In some example embodiments, the second semiconductor device 400 may include an overhang portion OR2 protruding from a second sidewall from the interposer 200. An outer edge of the second semiconductor device 400 may protrude from the second sidewall of the interposer 200. The second semiconductor device 400 may extend laterally from the second sidewall of the interposer 200. In plan view, the outer edge of the interposer 200 may be located more inward than the outer edge of the second semiconductor device 400.

One first semiconductor device 300 and one second semiconductor device 400 are illustrated in FIGS. 1-3, however, the inventive concepts are not limited thereto. For example, the second semiconductor device 400 may include a buffer die and a plurality of memory dies (chips) stacked on the buffer die. The buffer die and memory dies may be electrically connected to each other by TSVs.

In some example embodiments, the semiconductor package 10 may further include a first adhesive 250 underfilled between the interposer 200 and the package substrate 100, a second adhesive 350 underfilled between the first semiconductor device 300 and the interposer 200, and/or a third adhesive 450 underfilled between the second semiconductor device 400 and the interposer 200.

For example, the first to third adhesives 250, 350, and 450 may include an epoxy material to reinforce a gap between the interposer 200 and the package substrate 100 and between the interposer 200 and each of the first and second semiconductor devices 300 and 400.

External connection pads may be disposed on a lower surface of the package substrate 100, and external connectors 110 for an electrical connection with an external device may be disposed on the external connection pads. The external connectors 110 may be, for example, solder balls. The semiconductor package 10 may be mounted on a module substrate by the external connectors 110, thus constituting a memory module.

As described above, the semiconductor package 10 may include the first semiconductor device 300 and the second semiconductor device 400 that are disposed on the interposer 200 to be spaced apart from each other and that are electrically connected to each other by the interposer 200. The first and/or second semiconductor devices 300 and 400 may include the overhang portions OR1 and OR2, respectively, protruding from the opposite sidewalls from the interposer 200. Thus, the size of the interposer 200 may be reduced or minimized, such that the interposer 200 may be easily manufactured and a manufacturing yield of the interposer 200 may be improved.

Hereinafter, a method of manufacturing the aforementioned semiconductor package will be described. The method of manufacturing the semiconductor package may be used to manufacture a 2.5D package. However, it will be understood that the method of manufacturing the semiconductor package according to some example embodiments is not limited thereto.

Figure 5:
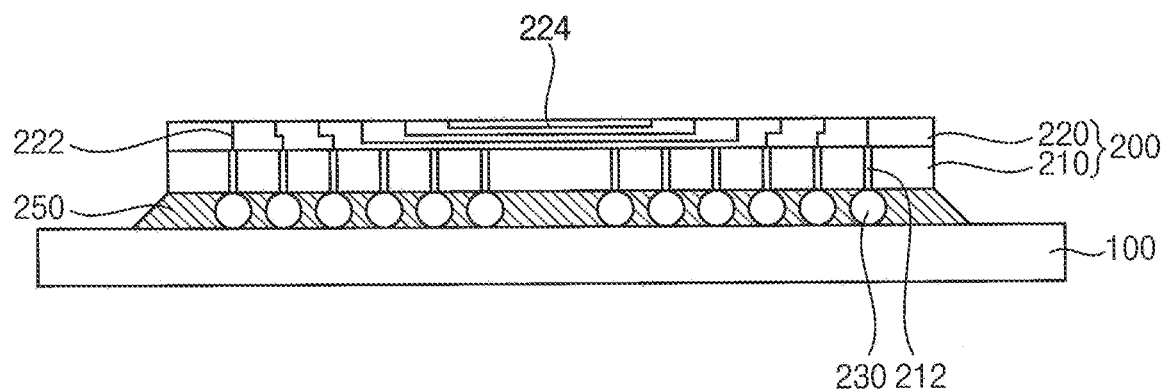
FIGS. 5 to 8 are views illustrating a method of manufacturing a semiconductor package according to some example embodiments of the inventive concepts.
Figure 6:
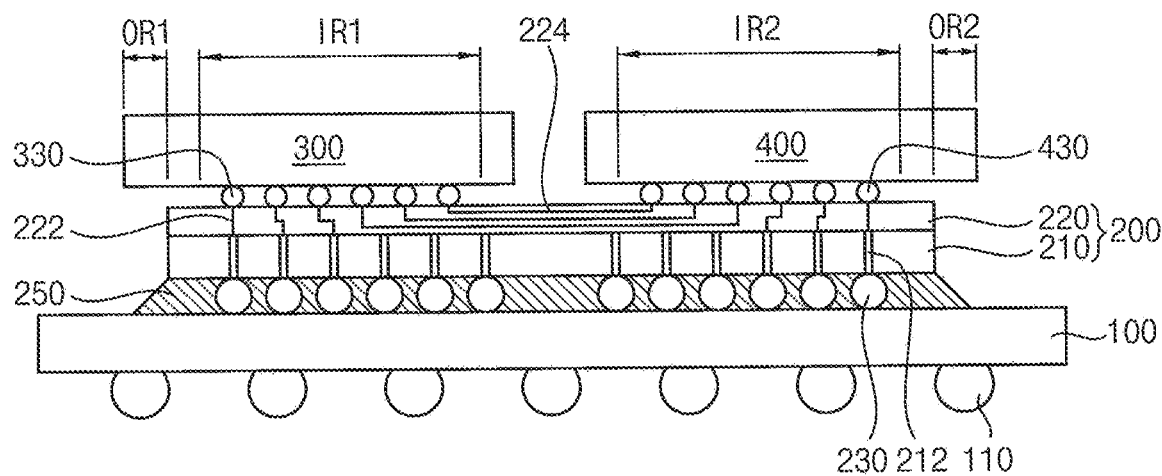
Figure 7:
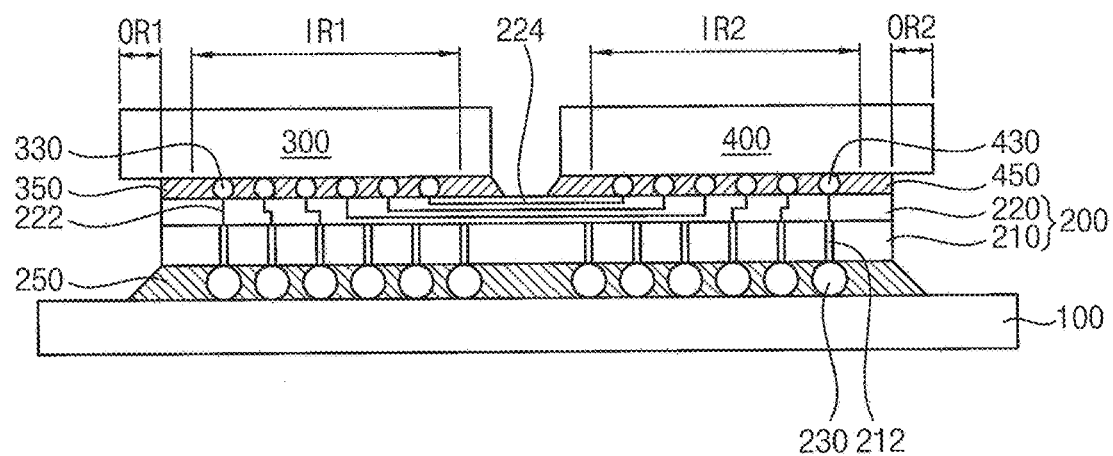
Figure 8:
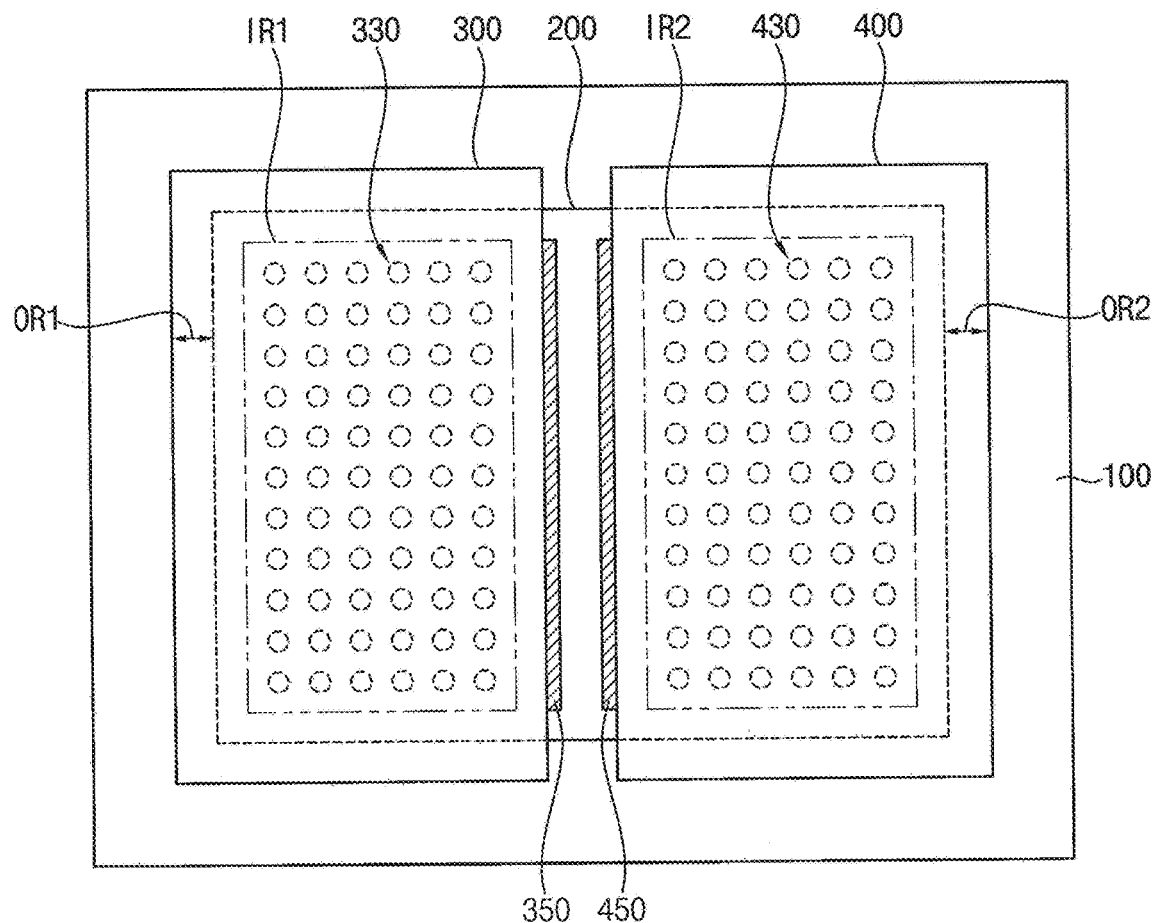

FIGS. 5 to 8 are views illustrating a method of manufacturing a semiconductor package according to some example embodiments of the inventive concepts. FIGS. 5 to 7 are cross-sectional views illustrating a method of manufacturing a semiconductor package according to some example embodiments of the inventive concepts, and FIG. 8 is a planar view of FIG. 7.

Referring to FIG. 5, the interposer 200 may be disposed on the package substrate 100.

In some example embodiments, after a plurality of silicon interposer dies are formed on a wafer, the wafer may be sawed to form individual silicon interposers. Each individual silicon interposer (e.g., interposer 200) may be mounted on the package substrate 100.

The interposer 200 may be mounted on the package substrate 100 by the solder bumps 230. The first adhesive 250 may be underfilled between the interposer 200 and the package substrate 100. A planar area of the interposer 200 may be less than a planar area of the package substrate 100. In plan view, the interposer 200 may be disposed within the area of the package substrate 100.

The interposer 200 may include a plurality of connection wiring lines therein. The interposer 200 may include a semiconductor substrate 210 (e.g., silicon substrate) and/or the wiring layer 220 including a plurality of wiring lines on an upper surface of the semiconductor substrate 210. The plurality of wiring lines may include the first wiring lines 222 and/or the second wiring lines 224. The semiconductor substrate 210 may include a plurality of through-electrodes 212 passing therethrough. The through-electrodes 212 may each include a through-silicon via (TSV).

Referring to FIG. 6, the first semiconductor device 300 and/or the second semiconductor device 400 may be disposed on the interposer 200 and may be spaced apart from each other.

In some example embodiments, the first and/or second semiconductor devices 300 and 400 may be mounted on the interposer 200 by the flip chip bonding method. Chip pads of the first semiconductor device 300 may be electrically connected to connection pads of the interposer 200 by conductive bumps, for example, the solder bumps 330. Chip pads of the second semiconductor device 400 may be electrically connected to the connection pads of the interposer 200 by the conductive bumps, for example, the solder bumps 430.

For example, the first semiconductor device 300 may include a logic semiconductor device, and/or the second semiconductor device 400 may include a memory device. The logic semiconductor device may include a CPU, a GPU, an ASIC, and/or an SOC. The memory device may include a high bandwidth memory device.

Referring to FIGS. 7 and 8, the second adhesive 350 may be underfilled between the first semiconductor device 300 and the interposer 200. The third adhesive 450 may be underfilled between the second semiconductor device 400 and the interposer 200.

An underfill solution may be dispensed between the interposer 200 and the first semiconductor device 300 from a dispenser nozzle while moving the dispenser nozzle along an inner edge of the first semiconductor device 300. The underfill solution may be cured to form the second adhesive 350.

Likewise, the underfill solution may be dispensed between the interposer 200 and the second semiconductor device 400 from the dispenser nozzle while moving the dispenser nozzle along an inner edge of the second semiconductor device 400. The underfill solution may be cured to form the third adhesive 450.

For example, the first, second, and/or third adhesives 250, 350, and 450 may include an epoxy material and may reinforce a gap between the package substrate 100 and the interposer 200 and/or a gap between each of the first and second semiconductor devices 300 and 400 and the interposer 200.

In general, after different semiconductor chips are mounted on respective ones of a plurality of silicon interposer dies on the wafer to be spaced apart from each other, the wafer may be sawed to be divided into individual interposer dies. One interposer on which the semiconductor chips are mounted may be mounted on the package substrate. Thus, the semiconductor chips may not be disposed to protrude outward from the interposer, such that a size of the interposer may not be reduced.

However, according to some example embodiments of the inventive concepts, after the wafer including the plurality of silicon interposers are sawed, each individual silicon interposer 200 may be mounted on the package substrate. Thereafter, the first and/or second semiconductor devices 300 and 400 may be disposed on the interposer 200 to be spaced apart from each other. The first and/or second semiconductor devices 300 and 400 may be disposed to protrude outward from the interposer 200 (outer edges of the first and second semiconductor devices 300 and 400 may be disposed to protrude outward from the respective sidewalls of the interposer 200). Thus, the size of the interposer 200 may be reduced. In other words, since each of the first and second semiconductor devices 300 and 400 has an overhang structure with respect to the interposer 200, the size of interposer 200 may be reduced or minimized, such that the interposer 200 may be easily manufactured and the manufacturing yield of the interposer 200 may be improved.

Figure 9:
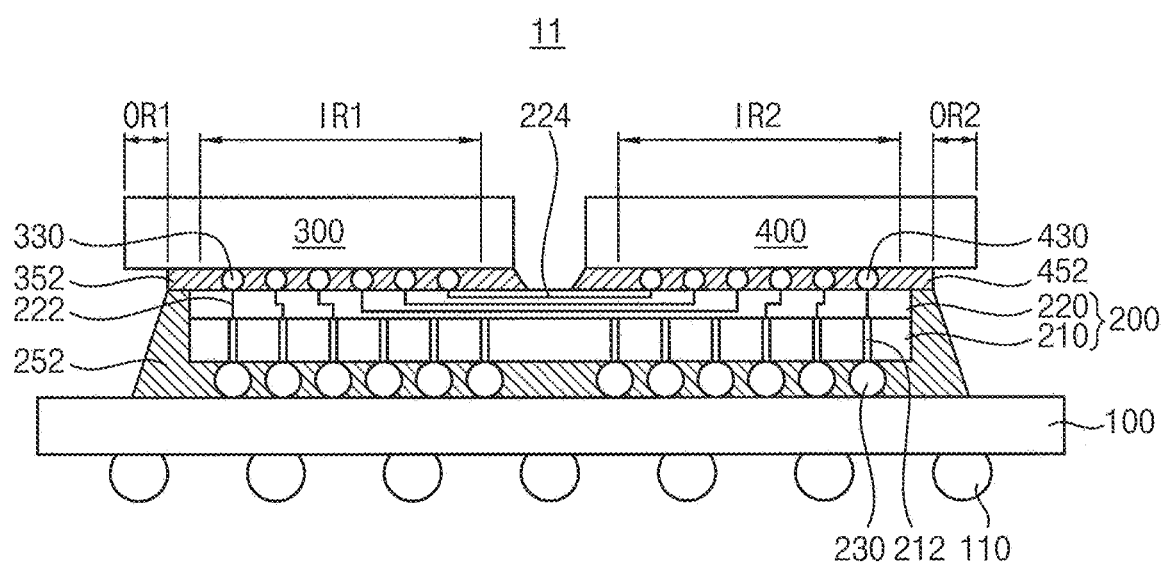
FIG. 9 is a cross-sectional view illustrating a semiconductor package according to some example embodiments of the inventive concepts.

FIG. 9 is a cross-sectional view illustrating a semiconductor package according to some example embodiments of the inventive concepts. In FIG. 9, a semiconductor package 11 may be the same as the semiconductor package 10 except for the first to third adhesives. The same reference numerals are used to denote the same elements as in FIG. 1, and thus repeated descriptions thereof are omitted.

Referring to FIG. 9, the semiconductor package 11 may include a first adhesive 252 underfilled between the interposer 200 and the package substrate 100, a second adhesive 352 underfilled between the first semiconductor device 300 and the interposer 200, and/or a third adhesive 452 underfilled between the second semiconductor device 400 and the interposer 200.

The first adhesive 252 may extend upward from an upper surface of the package substrate 100 along sidewalls of the interposer 200. The first adhesive 252 may have substantially the same height as a height of the interposer 200, with respect to the upper surface of the package substrate 100. The second adhesive 352 may extend from the first sidewall of the interposer 200 to an upper surface of the first adhesive 252. The third adhesive 452 may extend from the second sidewall of the interposer 200 to the upper surface of the first adhesive 252.

Accordingly, the first adhesive 252 may contact and support the second adhesive 352 and/or the third adhesive 452. Thus, the first to third adhesives 252, 352, and 452 may strongly support the first and second semiconductor devices 300 and 400 having the overhang structures.

Hereinafter, a method of manufacturing the semiconductor package 11 of FIG. 9 will be described.

Figure 10:
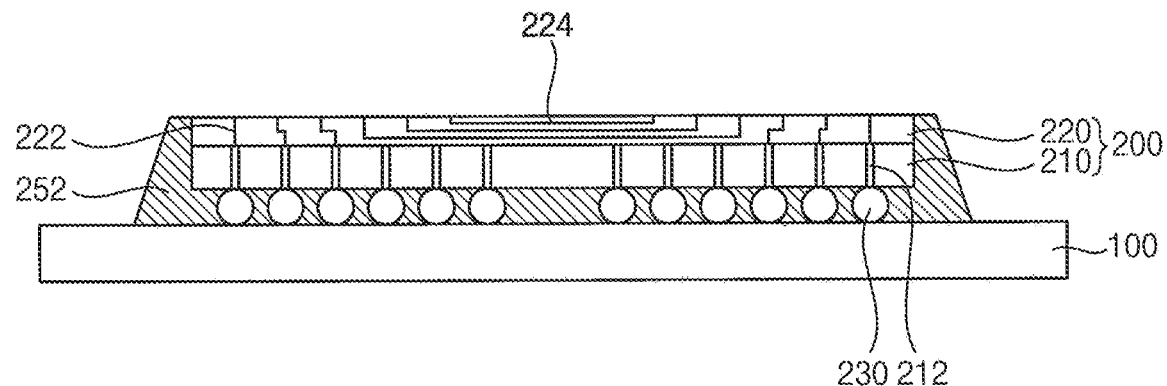
FIG. 10 is a cross-sectional view illustrating a method of manufacturing a semiconductor package according to some example embodiments of the inventive concepts.

FIG. 10 is a cross-sectional view illustrating a method of manufacturing a semiconductor package according to some example embodiments of the inventive concepts.

Referring to FIG. 10, after the interposer 200 is disposed on the package substrate 100, the first adhesive 252 may be underfilled between the interposer 200 and the package substrate 100.

In some example embodiments, while moving the dispenser nozzle along opposite sidewalls of the interposer 200, the underfill solution may be dispensed between the interposer 200 and the package substrate 100 from the dispenser nozzle. The underfill solution may be cured to form a preliminary adhesive.

Thereafter, while upwardly moving the dispenser nozzle relative to the package substrate 100 along the opposite sidewalls of the interposer 200, the underfill solution may be dispensed on the preliminary adhesive from the dispenser nozzle. The underfill solution may be cured to form the first adhesive 252.

The first adhesive 252 may extend upward from the package substrate 100 along the opposite sidewalls of the interposer 200. A height of the first adhesive 252 may be substantially the same as a height of the interposer 200 with respect to the upper surface of the package substrate 100.

Thereafter, the same or similar processes as described with reference to FIGS. 6 to 8 may be performed to manufacture the semiconductor package 11.

Figure 11:
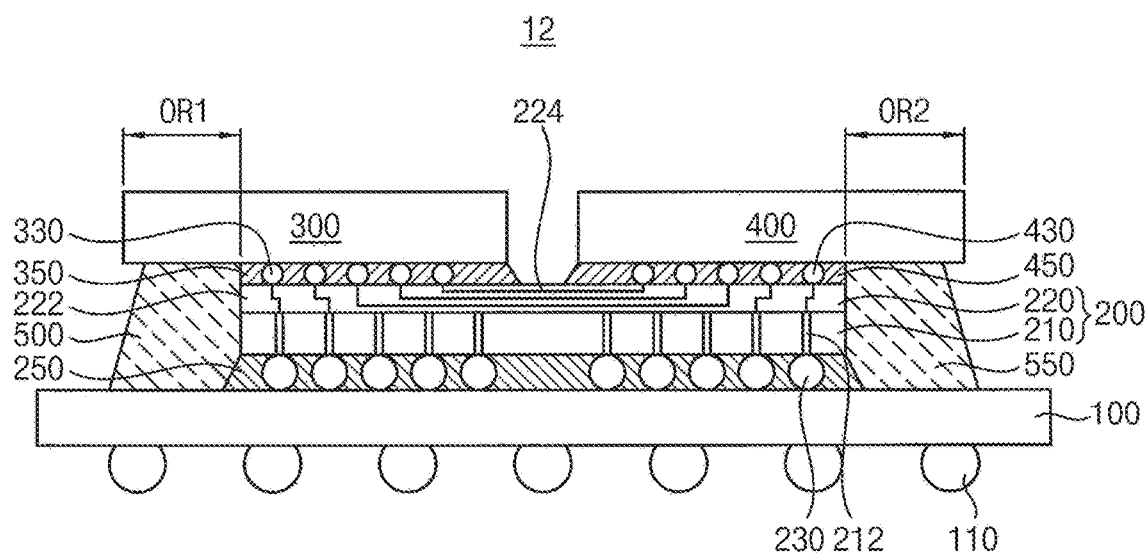
FIG. 11 is a cross-sectional view illustrating a semiconductor package according to some example embodiments of the inventive concepts.

FIG. 11 is a cross-sectional view illustrating a semiconductor package according to some example embodiments of the inventive concepts. In FIG. 11, a semiconductor package 12 may be the same as the semiconductor package 10 except for an additional adhesive. The same reference numerals are used to denote the same elements as in FIG. 1, and thus repeated descriptions thereof are omitted.

Referring to FIG. 11, the semiconductor package 12 may include a fourth adhesive 500 underfilled between the first semiconductor device 300 and the package substrate 100 and/or a fifth adhesive 550 underfilled between the second semiconductor device 400 and the package substrate 100.

The fourth adhesive 500 may be disposed between the first semiconductor device 300 and the package substrate 100 and may extend upward from the upper surface of the package substrate 100 along one sidewall of the interposer 200. The fourth adhesive 500 may contact and support the overhang portion OR1 of the first semiconductor device 300 relative to the interposer 200.

The fifth adhesive 550 may be disposed between the second semiconductor device 400 and the package substrate 100 and may extend upward from the upper surface of the package substrate 100 along the second sidewall of the interposer 200. The fifth adhesive 550 may contact and support the overhang portion OR2 of the second semiconductor device 400 relative to the interposer 200.

Thus, the fourth and/or fifth adhesives 500 and 550 may strongly support the first and/or second semiconductor devices 300 and 400 having the overhang structures.

Hereinafter, a method of manufacturing the semiconductor package 12 of FIG. 11 will be described.

Similar processes as described with reference to FIGS. 5 to 8 may be performed. Thus, the first and/or second semiconductor devices 300 and 400 may be mounted on the interposer 200, and then the fourth adhesive 500 may be underfilled between the first semiconductor device 300 and the package substrate 100 and the fifth adhesive 550 may be underfilled between the second semiconductor device 400 and the package substrate 100.

In some example embodiments, while moving a dispenser nozzle along one sidewall of the interposer 200, the underfill solution may be dispensed between the first semiconductor device 300 and the package substrate 100 from the dispenser nozzle. The underfill solution may be cured to form the fourth adhesive 500.

Next, while moving the dispenser nozzle along the second sidewall of the interposer 200, the underfill solution may be dispensed between the second semiconductor device 400 and the package substrate 100. The underfill solution may be cured to form the fifth adhesive 550.

The fourth adhesive 500 may extend upward from an upper surface of the package substrate 100 along the one sidewall of the interposer 200. The fourth adhesive 500 may contact and support the overhang portion OR1 of the first semiconductor device 300 relative to the interposer 200.

The fifth adhesive 550 may extend upward from the upper surface of the package substrate 100 along the second sidewall of the interposer 200. The fifth adhesive 550 may contact and support the overhang portion OR2 of the second semiconductor device 400 relative to the interposer 200.

Figure 12:
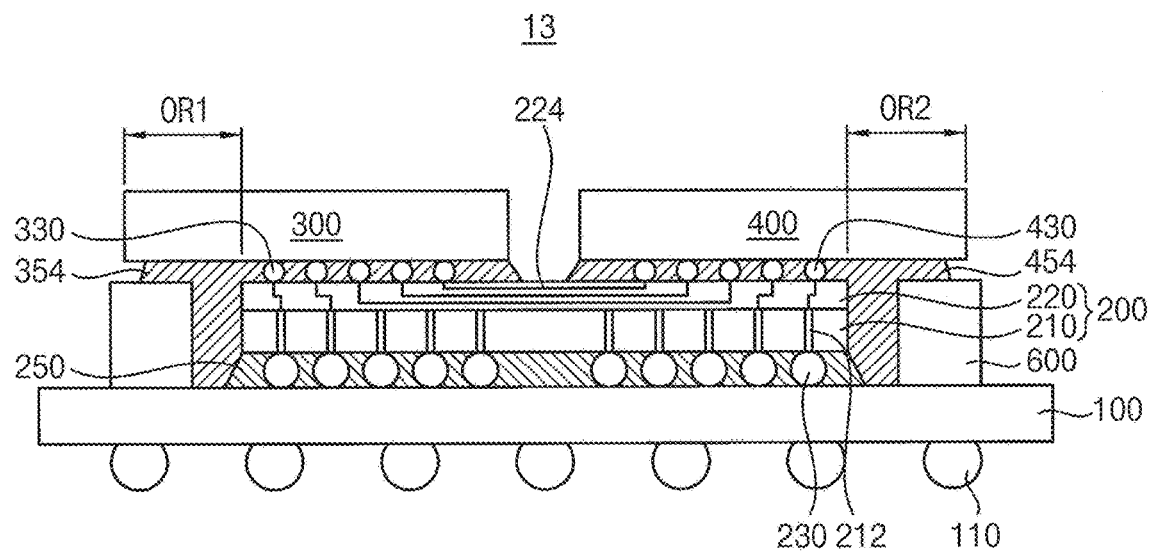
FIG. 12 is a cross-sectional view illustrating a semiconductor package according to some example embodiments of the inventive concepts.

FIG. 12 is a cross-sectional view illustrating a semiconductor package according to some example embodiments of the inventive concepts. In FIG. 12, a semiconductor package 13 may be the same as the semiconductor package 10 except for structures of the second and third adhesives and an additional supporter. The same reference numerals are used to denote the same elements as in FIG. 1, and thus repeated descriptions thereof are omitted.

Referring to FIG. 12, the semiconductor package 13 may include supporters 600 disposed between the first semiconductor device 300 and the package substrate 100 and/or between the second semiconductor device 400 and the package substrate 100. The supporters 600 may be disposed around the interposer 200.

The supporter 600 may be disposed below the overhang portion OR1 of the first semiconductor device 300. The supporter 600 may have a pillar shape that extends upward from an upper surface of the package substrate 100. The supporter 600 may be spaced apart from the overhang portion OR1 of the first semiconductor device 300, thus forming a first gap therebetween. The supporter 600 may be spaced apart from one sidewall of the interposer 200, thus forming a second gap therebetween. A second adhesive 354 may laterally extend from the one sidewall of the interposer 200 to fill the first gap and may extend downward to fill the second gap.

The supporter 600 may be disposed below the overhang portion OR2 of the second semiconductor device 400. The supporter 600 may have a pillar shape that extends upward from the upper surface of the package substrate 100. The supporter 600 may be spaced apart from the overhang portion OR2 of the second semiconductor device 400, thus forming a third gap therebetween. The supporter 600 may be spaced apart from the second sidewall of the interposer 200, thus forming a fourth gap therebetween. A third adhesive 454 may laterally extend from the second sidewall of the interposer 200 to fill the third gap and may extend downward to fill the fourth gap.

Hereinafter, a method of manufacturing the semiconductor package 13 of FIG. 12 will be described.

Figure 13:
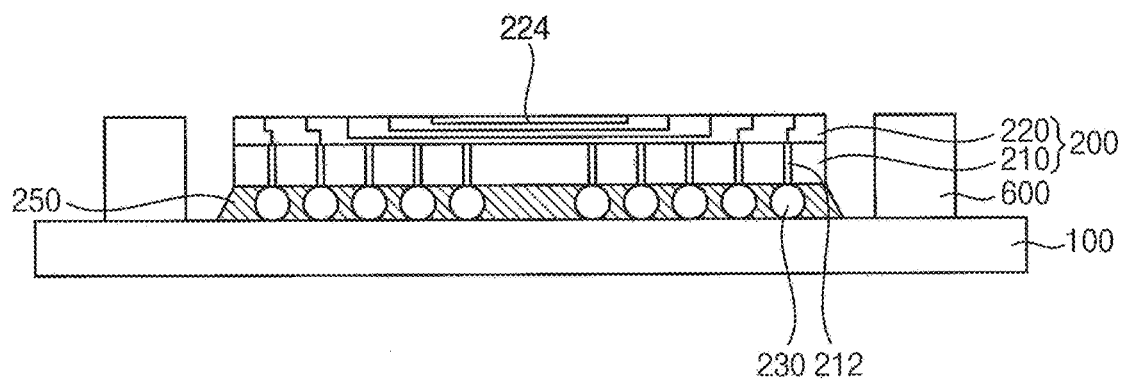
FIGS. 13 to 16 are views illustrating a method of manufacturing a semiconductor package according to some example embodiments of the inventive concepts.
Figure 14:
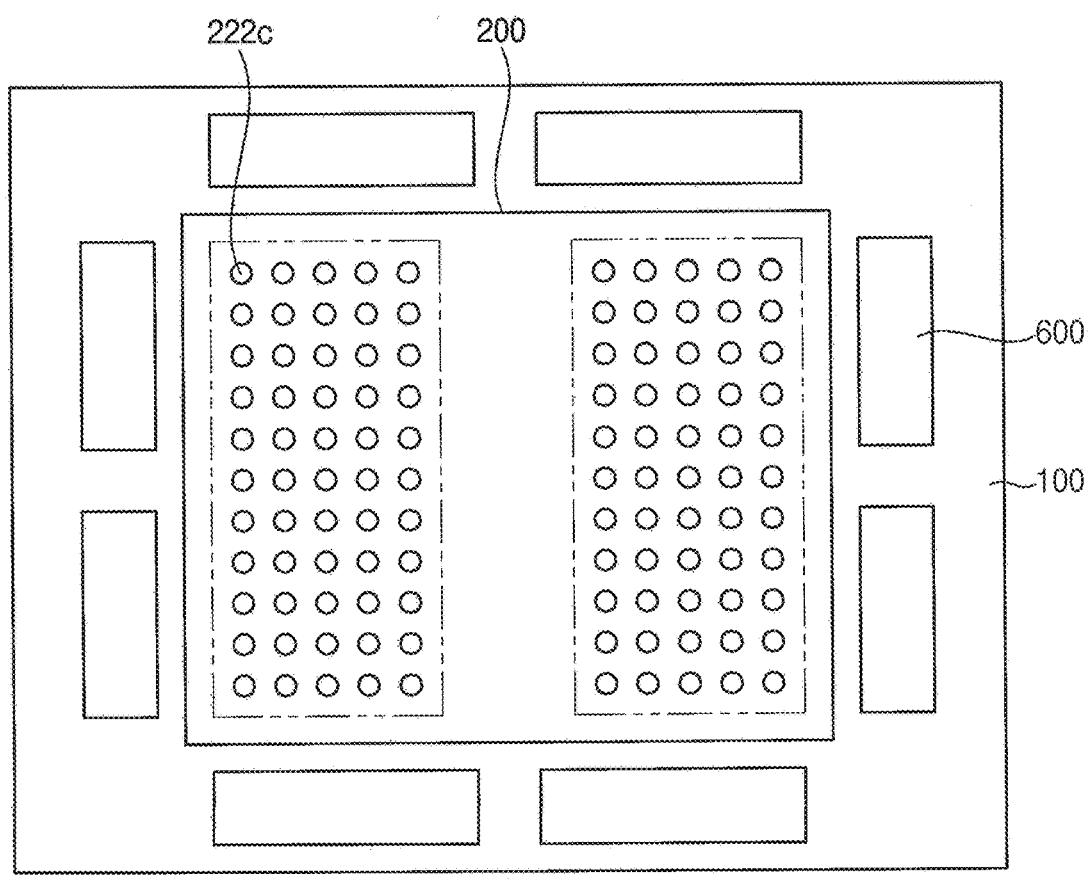
Figure 15:
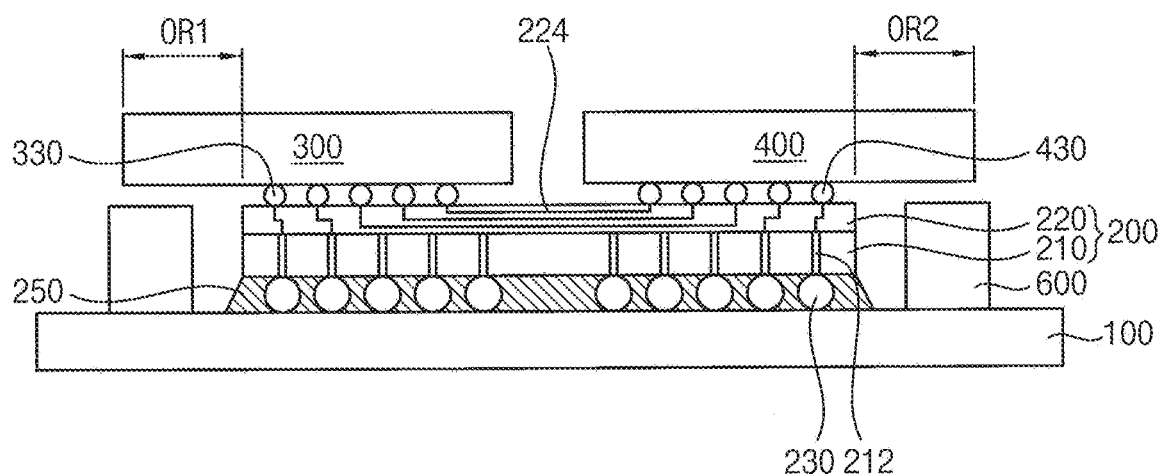
Figure 16:
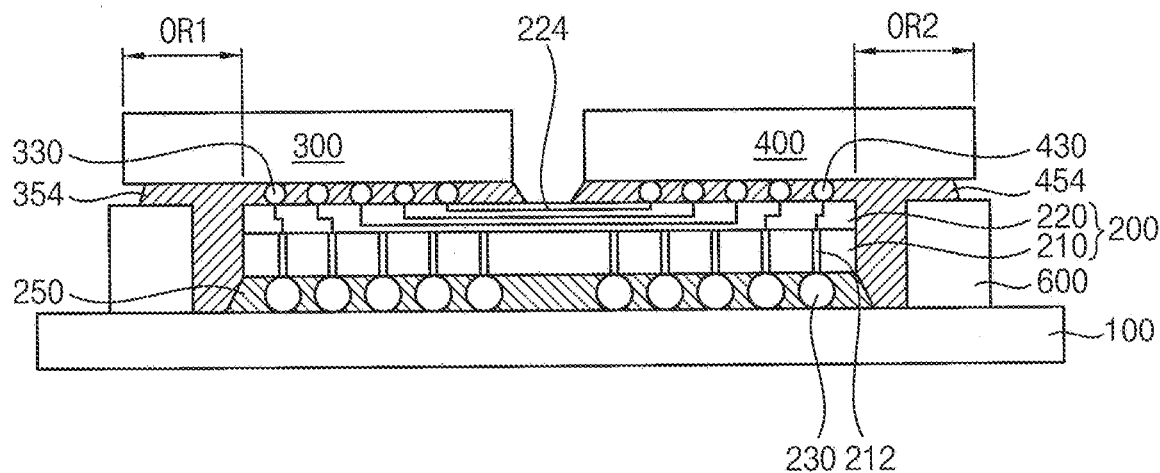

FIGS. 13 to 16 are views illustrating a method of manufacturing a semiconductor package according to some example embodiments of the inventive concepts. FIGS. 13, 15, and 16 are cross-sectional views illustrating a method of manufacturing a semiconductor package, and FIG. 14 is a plan view of FIG. 13.

Referring to FIGS. 13 and 14, the interposer 200 may be disposed on the package substrate 100, and a plurality of supporters 600 may be disposed on the package substrate 100.

In some example embodiments, the supporters 600 may be arranged around the interposer 200. A material such as an adhesive may be dispensed on the package substrate 100 to form the supporters 600.

The supporter 600 may have a pillar shape extending upward from the upper surface of the package substrate 100. The supporter 600 may be spaced apart from the first sidewall of the interposer 200, thus forming the second gap therebetween. The supporter 600 may be spaced apart from the second sidewall of the interposer 200, thus forming the fourth gap therebetween.

Referring to FIGS. 15 and 16, after the first and/or second semiconductor devices 300 and 400 are disposed on the interposer 200, the second adhesive 354 may be underfilled between the first semiconductor device 300 and the interposer 200, and/or the third adhesive 454 may be underfilled between the second semiconductor device 400 and the interposer 200.

In some example embodiments, the overhang portion OR1 of the first semiconductor device 300 may be spaced apart from the supporter 600, thus forming the first gap therebetween. The overhang portion OR2 of the second semiconductor device 400 may be spaced apart from the supporter 600, thus forming the third gap therebetween.

While moving a dispenser nozzle along an inner edge of the first semiconductor device 300, an underfill solution may be dispensed between the first semiconductor device 300 and the interposer 200 from the dispenser nozzle and then may be cured to form the second adhesive 354. At that time, the underfill solution may move into the first gap and the second gap and may be cured. Accordingly, the second adhesive 354 may extend laterally from the one sidewall of the interposer 200 to fill the first gap and may extend downward to fill the second gap.

Thereafter, while moving the dispenser nozzle along an inner edge of the second semiconductor device 400, the underfill solution may be dispensed between the second semiconductor device 400 and the interposer 200 from the dispenser nozzle and then may be cured to form the third adhesive 454. At that time, the underfill solution may move into the third gap and the fourth gap and may be cured. Accordingly, the third adhesive 454 may extend laterally from the second sidewall of the interposer 200 to fill the third gap and may extend downward to fill the fourth gap.

Figure 17:
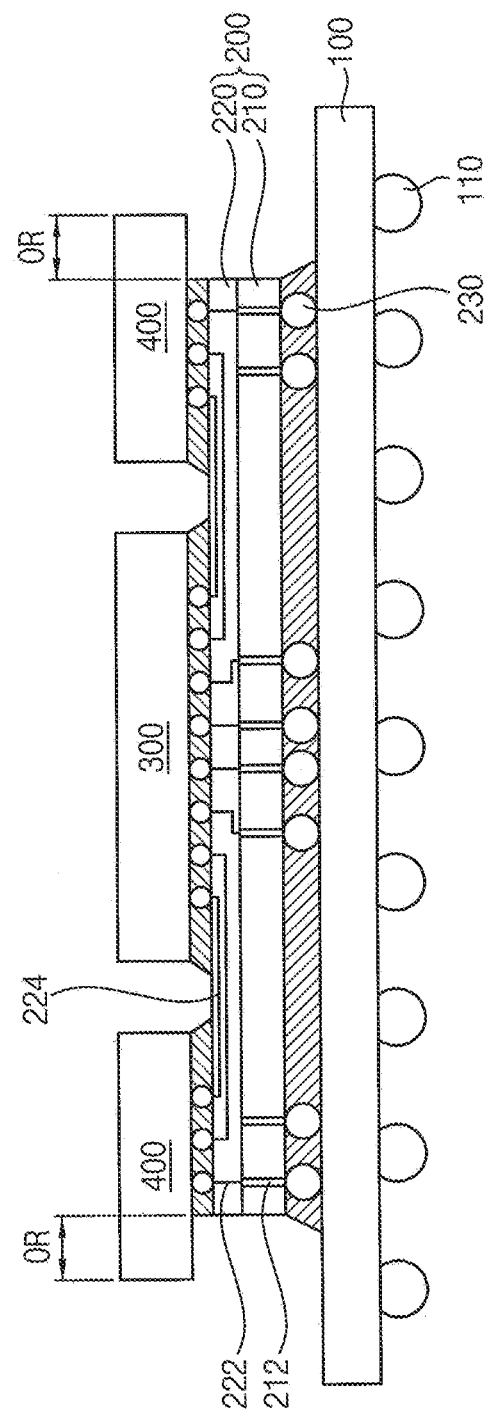
FIG. 17 is a cross-sectional view illustrating a semiconductor package according to some example embodiments of the inventive concepts.
Figure 18:
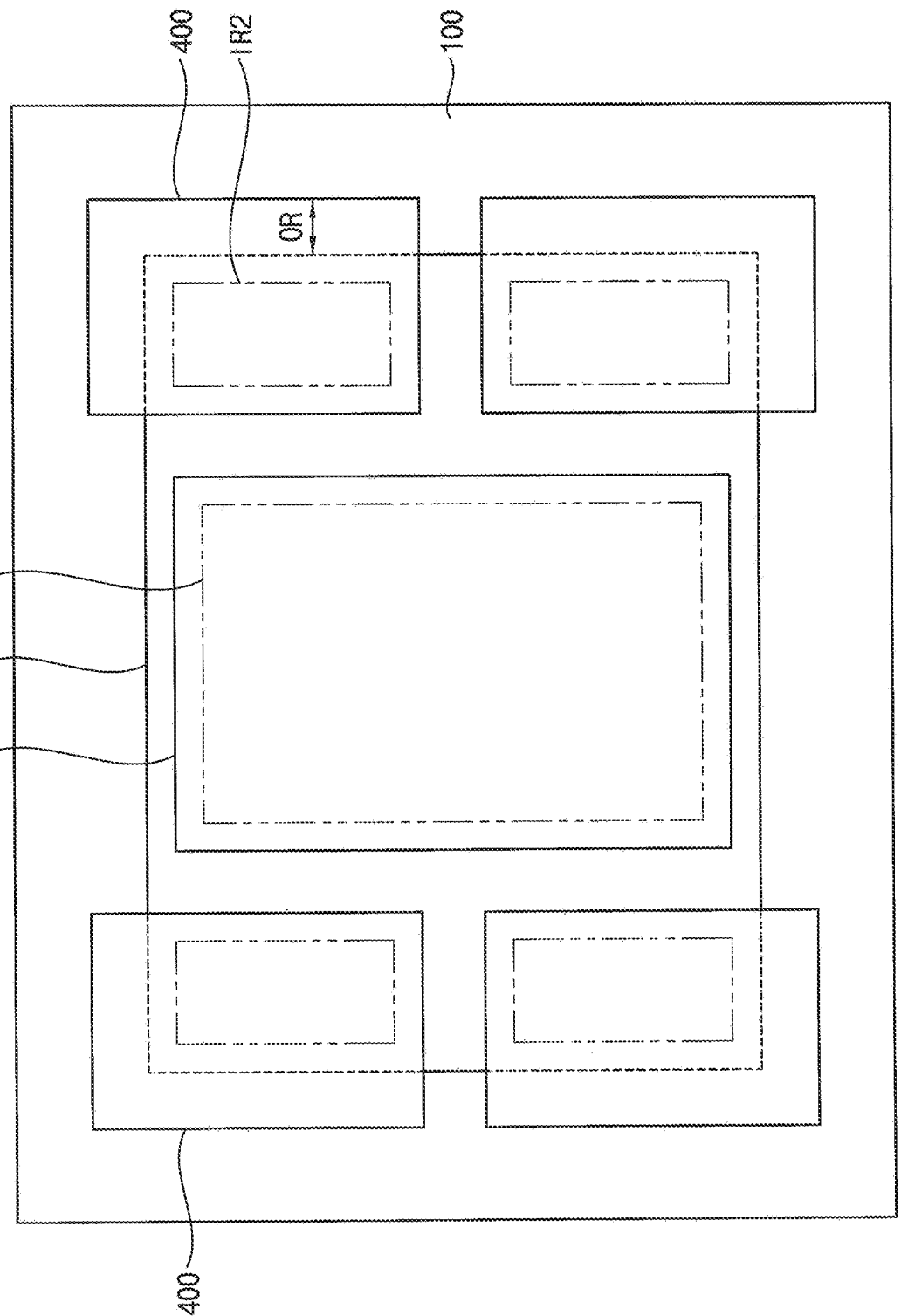
FIG. 18 is a plan view illustrating the semiconductor package of FIG. 17.

FIG. 17 is a cross-sectional view illustrating a semiconductor package according to some example embodiments of the inventive concepts. FIG. 18 is a plan view illustrating the semiconductor package of FIG. 17. In FIGS. 17 and 18, a semiconductor package 14 may be the same as the semiconductor package 10 except for arrangements and configurations of the first and second semiconductor devices. The same reference numerals are used to denote the same elements as in FIG. 1, and thus repeated descriptions thereof are omitted.

Referring to FIGS. 17 and 18, the semiconductor package 14 may include the package substrate 100, the interposer 200, the first semiconductor device 300, and/or a plurality of second semiconductor devices 400.

In some example embodiments, the first semiconductor device 300 may be disposed on a central portion of the interposer 200, and/or the second semiconductor devices 400 may be disposed on a peripheral region of the interposer 200. For example, four second semiconductor devices 400 may respectively be disposed on corner portions of the interposer 200.

The first semiconductor device 300 may include a logic semiconductor device. The second semiconductor devices 400 may each include a memory device. The logic semiconductor device may include a CPU, a GPU, an ASIC, and/or an SOC. The memory device may include a high bandwidth memory device.

In some example embodiments, in plan view, the first semiconductor device 300 may be disposed within an area of the interposer 200, and/or the second semiconductor devices 400 may be disposed to protrude from sidewalls of the interposer 200.

The second semiconductor devices 400 may each include an overhang portion OR protruding from adjacent sidewalls of the interposer 200. In plan view, an outer edge of the interposer 200 may be located more inward than outer edges of the second semiconductor devices 400.

The first and/or second semiconductor devices 300 and 400 may be electrically connected to the package substrate 100 through the first wiring lines 222 and through-electrodes 212. The first semiconductor device 300 and the second semiconductor devices 400 may be electrically connected to each other by the interposer 200. The first semiconductor device 300 and the second semiconductor devices 400 may be electrically connected to each other by the second wiring lines 224.

In some example embodiments, an electronic device including the semiconductor package according to some example embodiments may include, for example, a logic device, such as a central processing unit (CPU), a microprocessing unit (MPU) or an application processor (AP), a volatile memory device, such as a DRAM, an SRAM, and/or an HBM, or a nonvolatile memory device, such as a flash memory, a PRAM, an MRAM, and/or an RRAM. The electronic device may be applied to a TV, a computer, a portable computer, a laptop computer, a personal portable terminal, a tablet, a mobile phone, and/or a digital music player.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor package comprising:
    a package substrate;
    an interposer on the package substrate, the interposer including
       a semiconductor substrate, and
       a wiring layer on the semiconductor substrate and including a plurality of wiring lines;
    a first semiconductor device and a second semiconductor device on the interposer, the first and second semiconductor devices connected to each other by the interposer;
    a first adhesive between the first semiconductor device and the interposer, the first adhesive including a first epoxy material; and
    a second adhesive between the second semiconductor device and the interposer, the second adhesive including a second epoxy material,
    wherein the first adhesive and the second adhesive are separated by a gap,
    wherein the first semiconductor device includes an overhang portion protruding from a sidewall of the first adhesive,
    wherein there is a gap between at least a portion of a bottom surface of the overhang portion and an adhesive below the overhang portion, and
    wherein there are no conductive bumps beyond the sidewall of the first adhesive, under the overhang portion of the first semiconductor device, that electrically connect the first semiconductor device and the package substrate to each other.

2. The semiconductor package according to claim 1, wherein the first and second semiconductor devices are electrically connected to each other by at least one of the plurality of wiring lines.

3. The semiconductor package according to claim 1, wherein the semiconductor substrate includes a plurality of through-electrodes electrically connected to the plurality of wiring lines.

4. The semiconductor package according to claim 3, wherein the plurality of through-electrodes electrically connect the first and second semiconductor devices to the package substrate.

5. The semiconductor package according to claim 1, further comprising:

conductive bumps between the interposer and each of the first and second semiconductor devices.

6. The semiconductor package according to claim 1, further comprising:
    a third adhesive between the interposer and the package substrate.

7. The semiconductor package according to claim 6, wherein the third adhesive extends from the package substrate to the first adhesive.

8. The semiconductor package according to claim 6, further comprising:
    a fourth adhesive between the first semiconductor device and the package substrate.

9. The semiconductor package according to claim 1, further comprising:
    a supporter between the first semiconductor device and the package substrate.

10. The semiconductor package according to claim 1, wherein a planar area of the interposer is less than a planar area of the package substrate.

11. The semiconductor package according to claim 1, wherein in plan view, the interposer is within an area of the package substrate.

12. A semiconductor package comprising:
    a package substrate;
    a plurality of first solder bumps on the package substrate;
    an interposer on the plurality of first solder bumps, the interposer including a semiconductor substrate;
    a plurality of second solder bumps on the interposer;
    a plurality of first wiring lines and a plurality of second wiring lines in the interposer;
    a first semiconductor device and a second semiconductor device on the plurality of second solder bumps, the first semiconductor device and the second semiconductor device electrically connected to each other via the plurality of second wiring lines and the plurality of second solder bumps;
    a plurality of through-electrodes in the interposer, and electrically connecting the plurality of first wiring lines and the plurality of first solder bumps;
    a first adhesive between the interposer and the first semiconductor device, the first adhesive including a first epoxy material; and
    a second adhesive between the second semiconductor device and the interposer, the second adhesive including a second epoxy material,
    wherein the first adhesive and the second adhesive are separate by a gap,
    wherein the first semiconductor device includes an overhang portion protruding from a sidewall of the first adhesive, and
    wherein there is a gap between at least a portion of a bottom surface of the overhang portion and an adhesive below the overhang portion, and
    wherein there are no conductive bumps beyond the sidewall of the first adhesive, under the overhand portion of the first semiconductor device, that electrically connect the first semiconductor device and the package substrate to each other.

13. The semiconductor package according to claim 12, wherein the interposer includes a semiconductor substrate through which the plurality of through-electrodes pass.

14. The semiconductor package according to claim 12, further comprising:
    a third adhesive between the interposer and the package substrate.

15. The semiconductor package according to claim 14, wherein the third adhesive extends from the package substrate to the first adhesive.

16. The semiconductor package according to claim 12, further comprising:
a fourth adhesive between the first semiconductor device and the package substrate.

17. The semiconductor package according to claim 12, further comprising:
a supporter between the first semiconductor device and the package substrate.

18. The semiconductor package according to claim 12, further comprising:
a plurality of supporters around the interposer and between the package substrate and each of the first semiconductor device and the second semiconductor device.

19. The semiconductor package according to claim 12, wherein,
the first semiconductor device includes a logic semiconductor device, and
the second semiconductor device includes a high bandwidth memory device.

20. The semiconductor package according to claim 19, wherein,
the first semiconductor device includes a first overhang portion protruding from a first sidewall of the interposer, and
the second semiconductor device includes a second overhang portion protruding from a second sidewall of the interposer opposite to the first sidewall of the interposer.

21. A semiconductor package comprising:
a package substrate;
a plurality of first solder bumps on the package substrate;
an interposer on the plurality of first solder bumps, and including a semiconductor substrate and a wiring layer on the semiconductor substrate;
a plurality of second solder bumps and a plurality of third solder bumps on the wiring layer;
a plurality of first wiring lines and a plurality of second wiring lines in the wiring layer;
a first semiconductor device on the plurality of second solder bumps;
a second semiconductor device on the plurality of third solder bumps, and electrically connected to the first semiconductor device via the plurality of second wiring lines, the plurality of second solder bumps and the plurality of third solder bumps;
a plurality of through-electrodes through the semiconductor substrate, and electrically connecting the plurality of first wiring lines and the plurality of first solder bumps;
a first supporter between the first semiconductor device and the package substrate;
a second supporter between the second semiconductor device and the package substrate;
a first adhesive between the interposer and the first semiconductor device, the first adhesive including a first epoxy material; and
a second adhesive between the second semiconductor device and the interposer, the second adhesive including a second epoxy material,
wherein the first adhesive and the second adhesive are separated by a gap,
wherein the first semiconductor device includes an overhang portion protruding from a sidewall of the first adhesive,
wherein there is a gap between at least a portion of a bottom surface of the overhang portion and an adhesive below the overhang portion, and
wherein there are no conductive bumps beyond the sidewall of the first adhesive, under the overhang portion of the first semiconductor device, that electrically connect the first semiconductor device and the package substrate to each other.

* * * * *